(12) United States Patent
Suto et al.

(10) Patent No.: US 10,424,562 B2
(45) Date of Patent: Sep. 24, 2019

(54) LIGHT EMITTING DEVICE WITH PHOSPHORS

(71) Applicants: CITIZEN ELECTRONICS CO., LTD., Fujiyoshida-shi, Yamanashi (JP); CITIZEN WATCH CO., LTD., Tokyo (JP)

(72) Inventors: Yuki Suto, Fujiyoshida (JP); Jo Kinosita, Fujiyoshida (JP)

(73) Assignees: Citizen Electronics Co., Ltd., Yamanashi (JP); Citizen Watch Co., Ltd., Tokyo (JP)

(*) Notice: Subject to any disclaimer, the term of this patent is extended or adjusted under 35 U.S.C. 154(b) by 454 days.

(21) Appl. No.: 14/965,271

(22) Filed: Dec. 10, 2015

(65) Prior Publication Data

US 2016/0169460 A1 Jun. 16, 2016

(30) Foreign Application Priority Data

Dec. 16, 2014 (JP) ................................. 2014-254411

(51) Int. Cl.
*H01L 25/075* (2006.01)
*H01L 33/50* (2010.01)
*H01L 33/56* (2010.01)

(52) U.S. Cl.
CPC ........ *H01L 25/0753* (2013.01); *H01L 33/504* (2013.01); *H01L 33/505* (2013.01); *H01L 33/56* (2013.01); *H01L 2224/16225* (2013.01); *H01L 2924/0002* (2013.01)

(58) Field of Classification Search
CPC .. F21S 10/023; F21V 9/02; F21V 9/38; F21V 9/40; F21V 9/45; H01L 33/504; H01L 25/0753; F21K 9/64
See application file for complete search history.

(56) References Cited

U.S. PATENT DOCUMENTS

2012/0319565 A1* 12/2012 Sakuta ................. H01L 33/504
313/503
2015/0271892 A1* 9/2015 Jesper ................. H04N 5/2256
315/153

FOREIGN PATENT DOCUMENTS

JP 2007-243056 9/2007

* cited by examiner

*Primary Examiner* — Bao Q Truong
*Assistant Examiner* — Steven Y Horikoshi
(74) *Attorney, Agent, or Firm* — RatnerPrestia (57) ABSTRACT

A light emitting device includes a first light emitting element, a second light emitting element, a first phosphor sheet containing a first phosphor and a third phosphor, and covering a top face of the first light emitting element, and a second phosphor sheet containing a second phosphor and a fourth phosphor, and covering a top face of the second light emitting element, wherein a peak wavelength of light which is wavelength-converted by the first phosphor or the third phosphor is equal to or less than a peak wavelength of light which is wavelength-converted by the second phosphor or the fourth phosphor.

3 Claims, 6 Drawing Sheets

LIGHT EMITTING DEVICE WITH PHOSPHORS

CROSS-REFERENCE TO RELATED APPLICATIONS

This application is based upon and claims the benefit of priority of prior Japanese Patent Application No. 2014-254411, filed on Dec. 16, 2014, the entire contents of which are incorporated herein by reference.

TECHNICAL FIELD

Embodiments discussed in the present specification relate to a light emitting device including a semiconductor light emitting element.

BACKGROUND

In recent years, a light emitting device obtaining white light by a combination of a semiconductor light emitting element such as a blue LED (Light-Emitting Diode) and a phosphor is in use. In particular, as such a light emitting device, a light emitting device including a semiconductor light emitting element of a blue LED and a plurality of phosphors to obtain white light of more natural tint (i.e., higher color rendering index) is known.

For example, Japanese Laid-open Patent Publication No. 2007-243056 describes a light emitting device including two blue LED chips emitting blue light. The light emitting device includes: a first phosphor layer made of a first phosphor stacked on one of the LED chips and excited by light emitted from the LED chip to emit green light; and a second phosphor layer made of a second phosphor stacked on the other LED chip and excited by light emitted from the LED chip to emit red light.

SUMMARY

The light emitting device described in Japanese Laid-open Patent Publication No. 2007-243056 can obtain white light from blue light emitted from one of the LED chips and output from the first phosphor layer, green light which is wavelength-converted by the first phosphor layer, blue light emitted from the other LED chip and output from the second phosphor layer, and red light which is wavelength-converted by the second phosphor layer.

On the other hand, by combining the larger number of lights having different wavelengths, the intensity of the light becomes higher at all wavelengths, and white light of more natural tint (i.e., higher color rendering index) can be obtained. However, when the number of light emitting elements such as LED chips is increased in a light emitting device, the size and cost of the light emitting device increase. It is consequently desirable that a plurality of different types of phosphors be included in a phosphor layer stacked on a light emitting element so that light having the larger number of different wavelengths can be emitted on the basis of outgoing light from one light emitting element.

However, when a plurality of different types of phosphors is included in a phosphor layer, there is the possibility that light which is wavelength-converted by a specific phosphor is absorbed by another phosphor and is again wavelength-converted. To obtain desired light, the amount of phosphors included in a phosphor layer is preferably adjusted in consideration of the fact that light which is wavelength-converted by a specific phosphor is absorbed by another phosphor. Depending on combinations of phosphors included in a phosphor layer, a large amount of phosphors is necessary. When the amount of the phosphors increases, light transmittance becomes lower, and the intensity of light to be emitted becomes lower.

There is also the possibility that, depending on combinations of phosphors included in a phosphor layer, manufacturing variations in colors of lights emitted from respective phosphor layers become larger due to errors in manufacture in the amounts of the phosphors included in the phosphor layers.

An object is to obtain white light having higher light intensity in a light emitting device using a plurality of light emitting elements and a plurality of phosphors and to reduce manufacturing variations of the light emitting device.

A light emitting device according to an embodiment includes a first light emitting element, a second light emitting element, a first phosphor sheet containing a first phosphor and a third phosphor different from the first phosphor, and covering a top face of the first light emitting element, and a second phosphor sheet containing a second phosphor different from the first phosphor and a fourth phosphor different from the second phosphor, and covering a top face of the second light emitting element, wherein a peak wavelength of light which is wavelength-converted by the first phosphor is equal to or less than a peak wavelength of light which is wavelength-converted by the second phosphor and is equal to or less than a peak wavelength of light which is wavelength-converted by the fourth phosphor, and a peak wavelength of light which is wavelength-converted by the third phosphor is equal to or less than the peak wavelength of light which is wavelength-converted by the second phosphor and is equal to or less than a peak wavelength of light which is wavelength-converted by the fourth phosphor.

Preferably, the light emitting device further includes a white reflection resin provided between the first phosphor sheet and the second phosphor sheet.

Preferably, the white reflection resin is provided in a position interrupting a portion between a side face of the first phosphor sheet and a side face of the second phosphor sheet opposed to the side face of the first phosphor sheet.

A light emitting device according to an embodiment includes a first light emitting element, a second light emitting element, a third light emitting element, a first phosphor sheet containing a first phosphor and covering a top face of the first light emitting element, a second phosphor sheet containing a second phosphor different from the first phosphor and covering a top face of the second light emitting element, and a third phosphor sheet containing a third phosphor and a fourth phosphor different from the third phosphor and covering a top face of the third light emitting element, and a second white reflection resin provided between the second phosphor sheet and third phosphor sheet, wherein a peak wavelength of light which is wavelength-converted by the first phosphor is equal to or less than a peak wavelength of light which is wavelength-converted by the second phosphor, and a peak wavelength of light which is wavelength-converted by the second phosphor is equal to or less than the peak wavelength of light which is wavelength-converted by the third phosphor and is equal to or less than a peak wavelength of light which is wavelength-converted by the fourth phosphor.

Preferably, the light emitting device further includes a white reflection resin provided between the first phosphor sheet and the second phosphor sheet, and a second white reflection resin provided between the second phosphor sheet and the third phosphor sheet.

Preferably, the white reflection resin is provided in a position interrupting a portion between a side face of the first phosphor sheet and a side face of the second phosphor sheet opposed to the side face of the first phosphor sheet, and the second white reflection resin is provided in a position interrupting a portion between a side face of the second phosphor sheet and a side face of the third phosphor sheet opposed to the side face of the second phosphor sheet.

In a light emitting device using a plurality of light emitting elements and a plurality of phosphors, it is possible to obtain white light having higher light intensity and to reduce manufacturing variations of the light emitting device.

Other features and advantages of the present light emitting device will be apparent from the ensuing description, taken in conjunction with the accompanying drawings, in which:

DESCRIPTION OF EMBODIMENTS

Hereinafter, light emitting devices according to an embodiment, will be described with reference to the drawings. However, it should be noted that the technical scope of the invention is not limited to these embodiments, and extends to the inventions described in the claims and their equivalents.

Figure 1A:
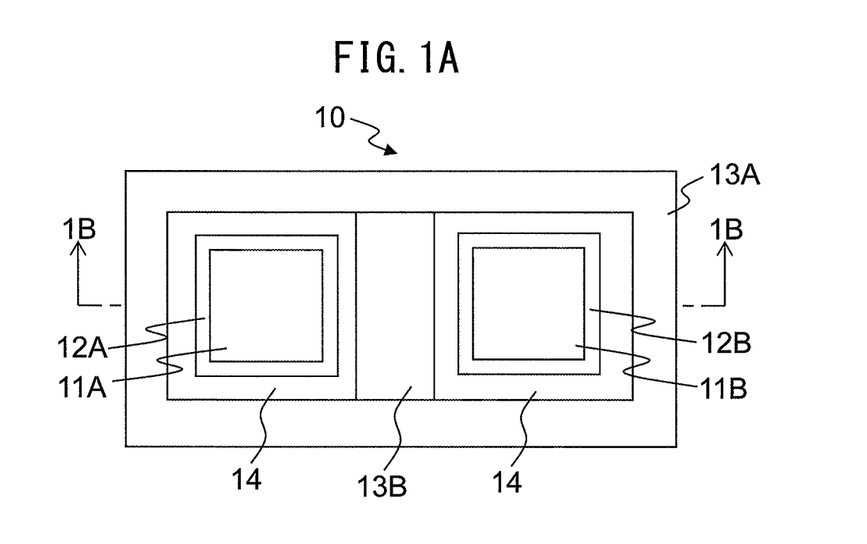
FIG. 1A is a schematic top view of a light emitting device 10.
Figure 1B:
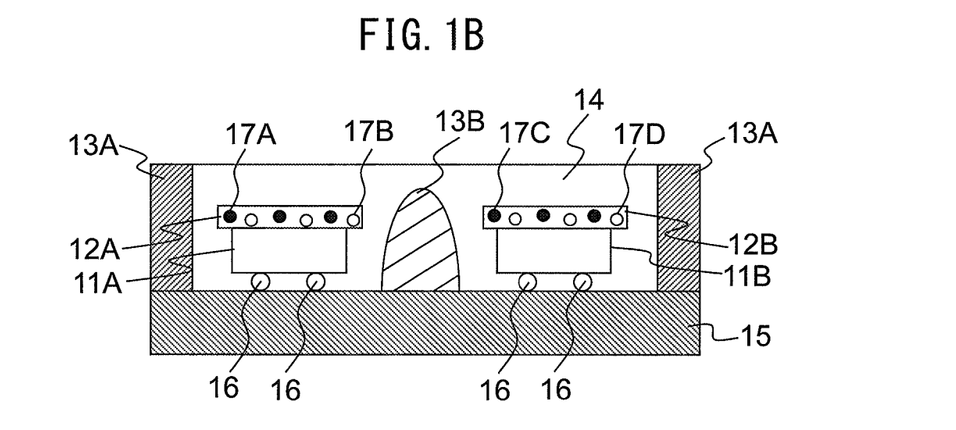
FIG. 1B is a schematic cross section of a light emitting device 10.

FIG. 1A is a schematic top view of a light emitting device 10. FIG. 1B is a cross section taken along line 1B-1B in FIG. 1A.

The light emitting device 10 includes a plurality of blue LEDs 11A and 11B, a plurality of phosphor sheets 12A and 12B, white reflection resins 13A and 13B, a diffusion resin 14, and a substrate 15.

Each of the blue LEDs 11A and 11B is flip-chip bonded on the substrate 15 and connected to the substrate 15 via bumps 16. The top face of the blue LED 11A is covered with the phosphor sheet 12A containing a specific phosphor, and the top face of the blue LED 11B is covered with the phosphor sheet 12B containing a phosphor different from the phosphor contained in the phosphor sheet 12A. Consequently, the light emitting device 10 mixes light emitted from the blue LED 11A and output from the phosphor sheet 12A, light which is wavelength-converted by the phosphor sheet 12A, light emitted from the blue LED 11B and output from the phosphor sheet 12B, and light which is wavelength-converted by the phosphor sheet 12B to obtain white light.

The blue LEDs 11A and 11B are semiconductor blue-light-emitting elements (blue elements). For the blue LEDs 11A and 11B, for example, an InGaN compound semiconductor having a light emission wavelength range of 440 to 455 nm is used. As the blue LEDs 11A and 11B, preferably, LEDs whose forward voltage (VF), temperature characteristics, life, and the like considered to be almost equal to each other, are used. Consequently, it is preferable to use LEDs using, as materials, compound semiconductors of the same series as the blue LEDs 11A and 11B.

The phosphor sheet 12A includes a colorless transparent resin such as epoxy resin or silicon resin and covers the top face of the blue LED 11A. In the phosphor sheet 12A, phosphors 17A and 17B are dispersedly mixed. The phosphor sheet 12B includes a colorless transparent resin such as epoxy resin or silicon resin and covers the top face of the blue LED 11B. In the phosphor sheet 12B, phosphors 17C and 17D are dispersedly mixed.

The phosphor 17A is a particulate phosphor material that absorbs blue light emitted from the blue LED 11A and wavelength-converts the light to cyan light. The range of the peak wavelength of the light which is wavelength-converted by the phosphor 17A is 480 to 500 nm. As the phosphor 17A, for example, a silicate phosphor which is activated by $Eu^{2+}$ (europium), a phosphor of barium silicon oxynitride, or the like is used.

The phosphor 17B is a phosphor different from the phosphor 17A and is a particulate phosphor material that absorbs blue light emitted from the blue LED 11A and wavelength-converts the light to yellow light. The range of the peak wavelength of the light which is wavelength-converted by the phosphor 17B is 535 to 570 nm. As the phosphor 17B, for example, a YAG (yttrium aluminum garnet) phosphor which is activated by cerium or the like is used.

The phosphor 17C is a phosphor different from the phosphors 17A and 17B and is a particulate phosphor material that absorbs blue light emitted from the blue LED 11B and wavelength-converts the light to yellow light. The range of the peak wavelength of the light which is wavelength-converted by the phosphor 17C is 535 to 570 nm. As the phosphor 17C, for example, a YAG (yttrium aluminum garnet) phosphor which is activated by cerium or the like is used. The phosphor 17C may be the same phosphor as the phosphor 17B.

The phosphor 17D is a phosphor different from the phosphors 17A, 17B, and 17C and is a particulate phosphor material that absorbs blue light emitted from the blue LED 11B and wavelength-converts the light to red light. The range of the peak wavelength of the light which is wavelength-converted by the phosphor 17C is 600 to 630 nm. As the phosphor 17D, for example, a $CaAlSiN_3$ (calcium aluminum silicon oxynitride) phosphor in which $Eu^{2+}$ (europium) is dissolved or the like is used.

The peak wavelength of the cyan light which is wavelength-converted by the phosphor 17A is set to be equal to or less than the peak wavelength of the yellow light which is wavelength-converted by the phosphor 17B. The peak wavelength of the yellow light which is wavelength-converted by the phosphor 17B is set to be equal to or less than the peak wavelength of the yellow light which is wavelength-converted by the phosphor 17C. The peak wavelength of the yellow light which is wavelength-converted by the phosphor 17C is set to be equal to or less than the peak wavelength of the red light which is wavelength-converted by the phosphor 17D.

The white reflection resin 13A is, for example, obtained by kneading reflective particles of titanium oxide, alumina, or the like into silicon resin and thermo-setting the resultant. The white reflection resin 13A is disposed on the substrate 15 so as to cover the side faces of the light emitting device 10. The white reflection resin 13A reflexes light output from the phosphor sheets 12A and 12B to the inside of the light emitting device 10.

The white reflection resin 13B is, like the white reflection resin 13A, for example, obtained by kneading reflective particles of titanium oxide, alumina, or the like into silicon resin and thermo-setting the resultant. The white reflection resin 13B is disposed on the substrate 15 so as to be provided between the phosphor sheets 12A and 12B. The white reflection resin 13B is provided in a position interrupting at least the portion between the side face of the phosphor sheet 12A and the side face of the phosphor sheet 12B opposed to the side face of the phosphor sheet 12A. The white reflection resin 13B reflexes light output from the phosphor sheet 12A to the phosphor sheet 12A side, and reflexes light output from the phosphor sheet 12B to the phosphor sheet 12B side. By the white reflection resin 13B, light emitted from the phosphor sheet 12A is prevented from being absorbed by the phosphors 17C and 17D contained in the phosphor sheet 12B.

The diffusion resin 14 is obtained by, for example, making a light diffusion agent of titanium oxide or the like contained in a transparent resin base material and is disposed so as to seal a region surrounded by the substrate 15 and the white reflection resin 13A. The diffusion resin 14 seals and protects the blue LEDs 11A and 11B and the phosphor sheets 12A and 12B, and uniformly irradiates and diffuses light emitted from the phosphor sheets 12A and 12B.

The substrate 15 is, for example, an insulating substrate such as a glass epoxy substrate, a BT resin substrate, a ceramic substrate, or a metal core substrate having a surface on which the blue LEDs 11A and 11B are mounted. On the substrate 15, electrodes (not illustrated) for bonding the blue LEDs 11A and 11B and a circuit pattern (not illustrated) are formed. Each of the electrodes of the blue LEDs 11A and 11B is flip-chip bonded on the substrate 15 and electrically connected to bonding electrodes on the substrate 15 via the bump 16. Each of the electrodes of the blue LEDs 11A and 11B may be bonded to bonding electrodes on the substrate 15 via a conductive adhesive material such as Ag paste, a wire by wire bonding, or the like. Further, the bonding electrodes on the substrate 15 are electrically connected to electrodes (not illustrated) for connection to a DC (Direct Current) power supply on the outside.

FIGS. 2A to 2E and FIG. 3 are graphs schematically illustrating spectra of lights emitted from LEDs and the phosphor. The horizontal axis of each of FIGS. 2A to 2E and FIG. 3 indicates wavelength which becomes longer to the right. The vertical axis of each of FIGS. 2A to 2E and FIG. 3 indicates intensity of light which becomes higher to the upside.

Figure 2A:
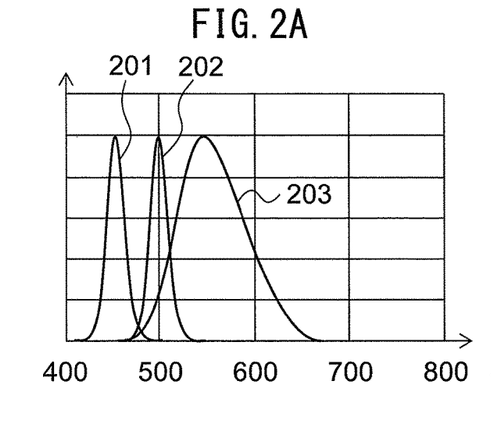
FIG. 2A is a graph schematically illustrating spectra of lights emitted from LEDs and phosphors.

Graph 201 in FIG. 2A indicates spectrum of blue light emitted from the blue LED 11A according to an example, graph 202 indicates spectrum of cyan light which is wavelength-converted by the phosphor 17A according to an example, and graph 203 indicates spectrum of yellow light which is wavelength-converted by the phosphor 17B according to an example. In FIG. 2A, spectra of lights normalized are displayed.

Figure 2B:
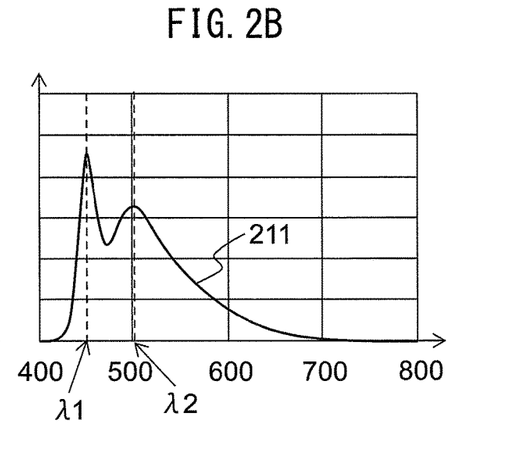
FIG. 2B is a graph schematically illustrating spectra of lights emitted from LEDs and phosphors.

Graph 211 in FIG. 2B indicates spectrum of light emitted from the phosphor sheet 12A. In the spectrum illustrated in FIG. 2B, respective peaks of intensities exist around peak wavelength $\lambda 1$ of the blue light and peak wavelength $\lambda 2$ of the cyan light. In the phosphor sheet 12A, the amount of the phosphors 17A and 17B contained in the phosphor sheet 12A is adjusted so that the intensity of the blue light is not too low. Consequently, the intensity in the peak wavelength $\lambda 2$ of the cyan light is lower than the peak in the peak wavelength $\lambda 1$ of the blue light and, in a region where the wavelength is longer than the peak wavelength $\lambda 2$, the wave shape base becomes broader and the intensity gently decreases as the wavelength becomes longer.

Figure 2C:
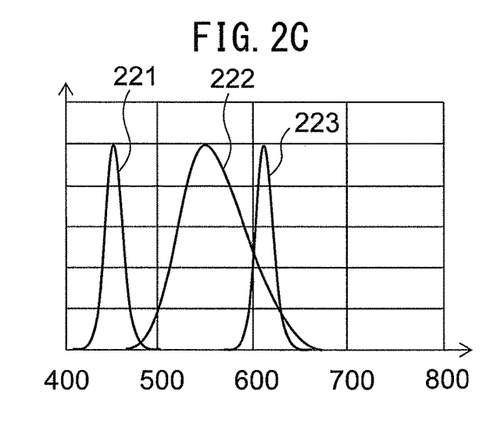
FIG. 2C is a graph schematically illustrating spectra of lights emitted from LEDs and phosphors.

Graph 221 in FIG. 2C indicates spectrum of blue light emitted from the blue LED 11B according to an example, graph 222 indicates spectrum of yellow light which is wavelength-converted by the phosphor 17C according to an example, and graph 223 indicates spectrum of red light which is wavelength-converted by the phosphor 17D according to an example. In FIG. 2C, spectra of lights normalized are displayed.

Figure 2D:
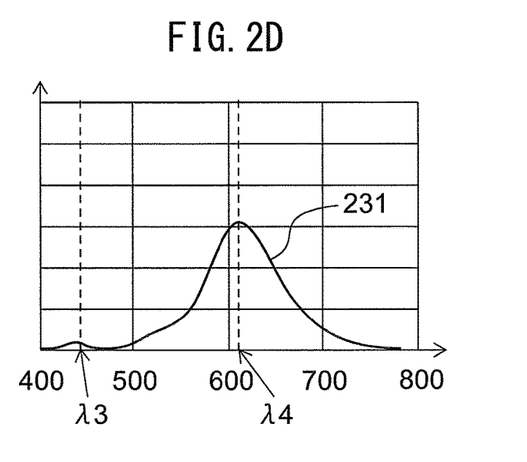
FIG. 2D is a graph schematically illustrating spectra of lights emitted from LEDs and phosphors.

Graph 231 in FIG. 2D indicates spectrum of light emitted from the phosphor sheet 12B. In the spectrum illustrated in FIG. 2D, respective peaks of intensities exist around peak wavelength $\lambda 3$ of the blue light and peak wavelength $\lambda 4$ of the red light. In the phosphor sheet 12B, blue light emitted from the blue LED 11B is absorbed by the phosphors 17C and 17D, and the yellow light which is wavelength-converted by the phosphor 17C is absorbed by the phosphor 17D. Consequently, the intensity of the blue light and the yellow light is low. However, the wave shape base whose peak is wavelength $\lambda 4$ becomes broader and the intensity gently decreases.

Figure 2E:
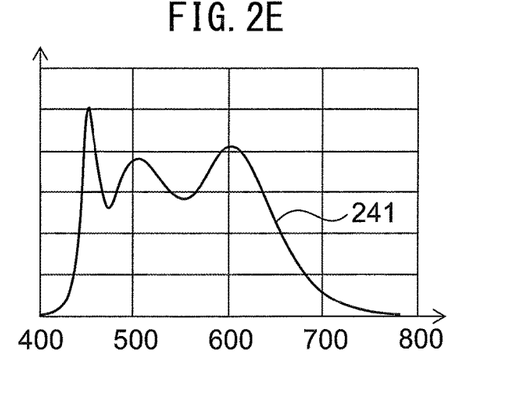
FIG. 2E is a graph schematically illustrating spectra of lights emitted from LEDs and phosphors.

Graph 241 in FIG. 2E indicates spectrum of the entire light output from the light emitting device 10. Since the white reflection region 13B is provided between the phosphor sheets 12A and 12B in the light emitting device 10, the light emitted from the phosphor sheet 12A is not absorbed by the phosphors 17C and 17D. Therefore, as illustrated in FIG. 2E, the spectrum of the light emitted from the light emitting device 10 almost matches a spectrum obtained by adding the intensities illustrated in graph 231 in FIG. 2D to the intensities illustrated in graph 211 in FIG. 2B at the respective wavelengths.

In the spectrum illustrated in FIG. 2E, a wavelength of low intensity does not exist, and the intensity is high in the entire wavelength. Therefore, the light emission spectrum of the entire light emitting device 10 is close to the spectrum of solar light, and white light emitted from the light emitting device 10 is white light of more natural tint (i.e., higher color rendering index).

Figure 3:
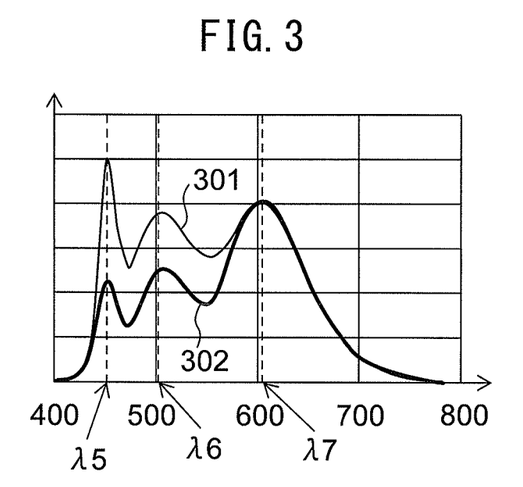
FIG. 3 is a graph schematically illustrating spectra of lights emitted by the light emitting device 10 and a phosphor sheet for comparison.

Graph 301 in FIG. 3 indicates spectrum of light emitted from the light emitting device 10 and graph 302 indicates spectrum of light emitted in the case of eliminating the white reflection resin 13B in the light emitting device 10. In the case of eliminating the white reflection resin 13B, the blue light emitted from the blue LED 11A and the cyan light which is wavelength-converted by the phosphor 17A are absorbed by the phosphors 17C and 17D, respectively. The yellow light which is wavelength-converted by the phosphor 17A is absorbed by the phosphor 17D. Therefore, in the spectrum illustrated by graph 302, the intensity of light having short wavelength (particularly, around peak wavelength $\lambda 5$ of the blue light and peak wavelength $\lambda 6$ of the cyan light) is low as compared with the spectrum illustrated by graph 301. Consequently, in the case of eliminating the white reflection resin 13B, total luminous flux of light emitted from the light emitting device 10 is low.

Since the white reflection resin 13B reflects light emitted from the side faces of the LEDs and the phosphors in the light-outgoing direction of the light emitting device 10, total luminous flux of the light emitted from the light emitting device 10 is high. By the white reflection resin 13B, the directivity of the light can be narrowed. In the case of further adding optical parts such as a lens and a reflection frame to the light emitting device 10, efficiency of light incidence to the optical parts can be increased, and optical design for the optical parts can be facilitated.

Figure 4:
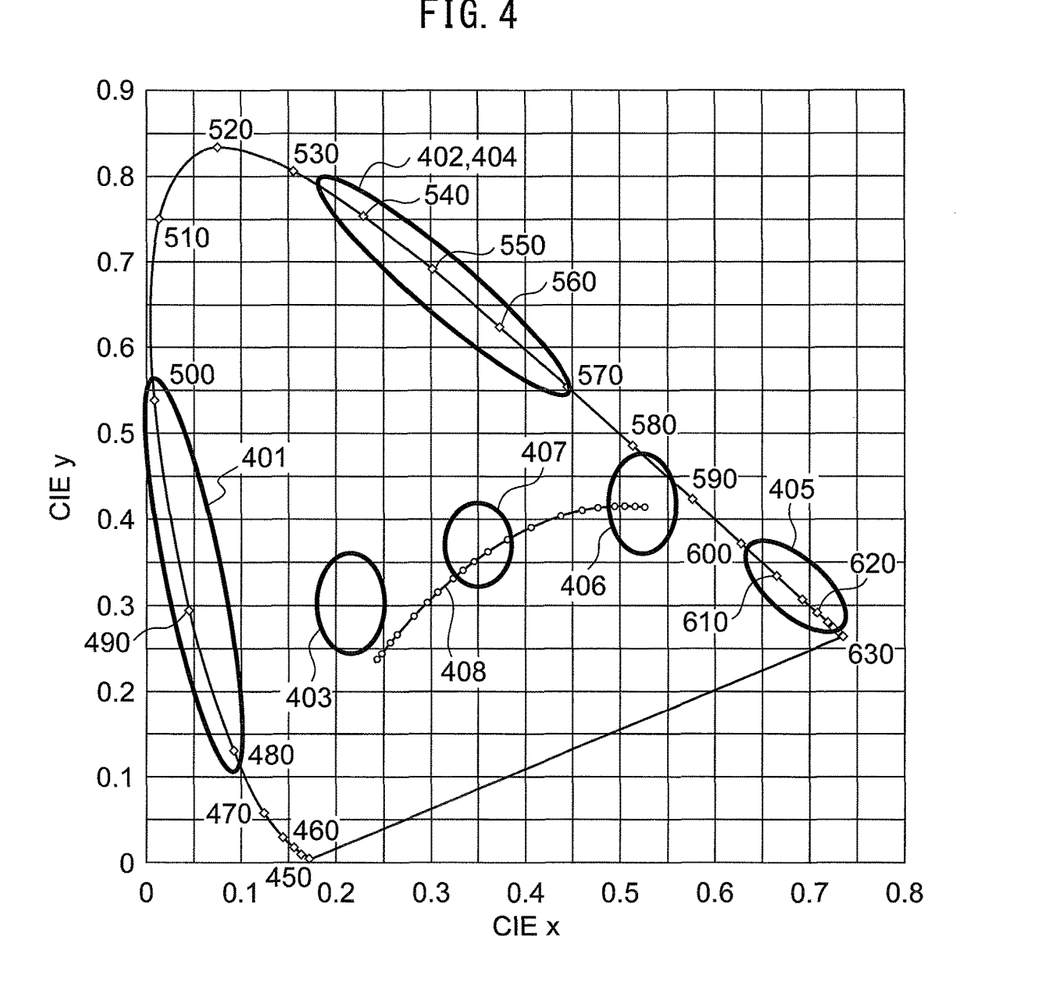
FIG. 4 is a CIExy chromaticity diagram of phosphors.

FIG. 4 is a CIE (Commission Internationale de l'Eclairage) xy chromaticity diagram of the phosphors 17A, 17B, 17C, and 17D used in the light emitting device 10. The horizontal axis of FIG. 4 indicates CIEx, and the vertical axis indicates CIEy.

A region 401 is a region corresponding to the cyan light which is wavelength-converted by the phosphor 17A, a region 402 is a region corresponding to the yellow light which is wavelength-converted by the phosphor 17B, and a region 403 is a region corresponding to light emitted from the phosphor sheet 12A. A region 404 is a region corresponding to the yellow light wavelength-converted by the phosphor 17C, a region 405 is a region corresponding to the red light wavelength-converted by the phosphor 17D, and a region 406 is a region corresponding to light emitted by the phosphor sheet 12B.

A region 407 is a region corresponding to light emission color of the entire light emitting device 10. The region 407 is positioned near a black-body locus 408, thereby indicating that light emitted from the light emitting device 10 is white light having high color rendering index.

White light can be also obtained from a phosphor sheet obtained by combining the phosphors 17A and 17D and a phosphor sheet obtained by combining the phosphors 17B and 17C. However, generally, a phosphor has characteristics of absorbing light having a shorter wavelength than the wavelength of light to be wavelength-converted and, the larger the difference between the wavelength of light to be absorbed and the wavelength of the light to be wavelength-converted is, absorbing larger amount of light. Consequently, when a phosphor sheet is manufactured by combining phosphors in which the wavelengths of light to be converted are largely different from each other such as the phosphors 17A and 17D, much of light which is wavelength-converted by the phosphor 17A is absorbed by the phosphor 17D and is again wavelength-converted. Therefore, to obtain desired light, a large amount of the phosphor 17A is preferably included in a phosphor sheet in consideration of the fact that the light which is wavelength-converted by the phosphor 17A is absorbed by the phosphor 17D. When the amount of the phosphors contained in the phosphor sheet is large, light transmittance is low, and the intensity of light emitted is low.

When wavelengths of lights which are wavelength-converted by phosphors are largely different, there is also the possibility that manufacturing variations for the colors of lights emitted from respective phosphor sheets become larger due to manufacture errors in the ratio of amounts of the phosphors included in the phosphor sheets.

As described above, the peak wavelength of light which is wavelength-converted by the phosphor 17A is equal to or less than the peak wavelength of light which is wavelength-converted by the phosphor 17C and is equal to or less than the peak wavelength of light which is wavelength-converted by the phosphor 17D. The peak wavelength of light which is wavelength-converted by the phosphor 17B is also equal to or less than the peak wavelength of light which is wavelength-converted by the phosphor 17C and is equal to or less than the peak wavelength of light which is wavelength-converted by the phosphor 17D.

In other words, the phosphor sheets of the light emitting device 10 are configured by a combination of the phosphors 17A and 17B and a combination of the phosphors 17C and 17D, whose wavelengths of lights converted are close to each other. Therefore, in the light emitting device 10, the amount of the phosphors contained in each phosphor sheet can be made small and the intensity of outgoing light can be made high. Since the wavelengths of lights which are wavelength-converted by the phosphors included in the phosphor sheet are close, variations occurring in the colors of lights emitted from the respective phosphor sheets can be suppressed even when an error occurs in the ratio of the amounts of the phosphors.

Figure 5A:
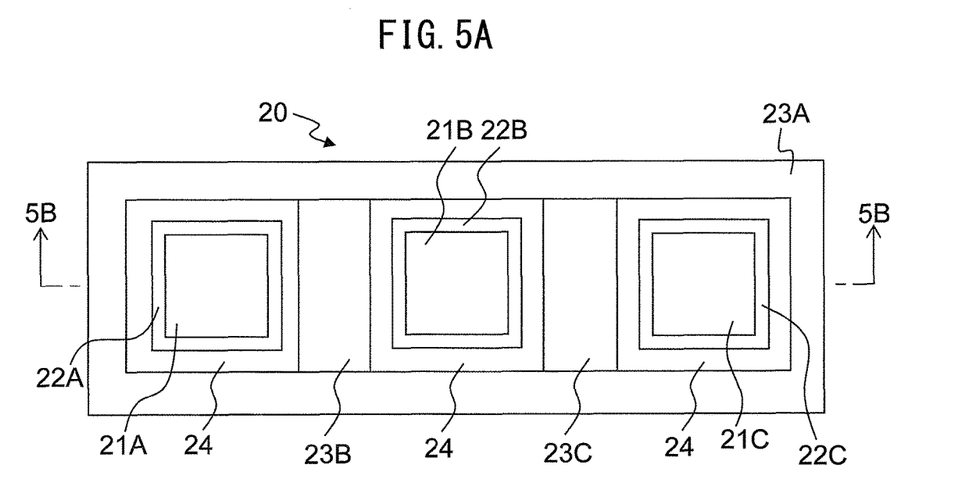
FIG. 5A is a schematic top view of a light emitting device 20.
Figure 5B:
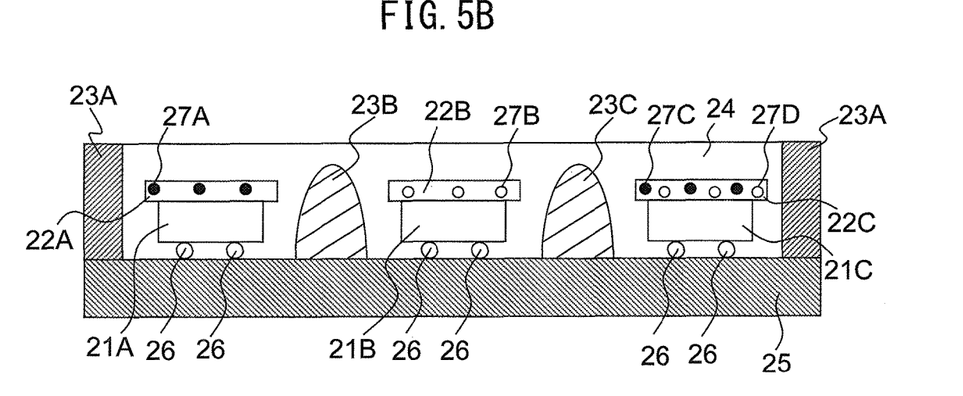
FIG. 5B is a schematic cross section of a light emitting device 20.

FIG. 5A is a schematic top view of a light emitting device 20. FIG. 5B is a cross section taken along line 5B-5B in FIG. 5A. The light emitting device 20 includes, in addition to the components of the light emitting device 10, a blue LED 21C, a phosphor sheet 22C, and a white reflection resin 23C.

The blue LEDs 21A, 21B, and 21C are semiconductor light emitting elements (blue elements) similar to the blue LEDs 11A and 11B, flip-chip bonded on a substrate 25, and connected to the substrate 25 via bumps 26.

The phosphor sheets 22A, 22B, and 22C cover the top faces of blue LEDs 21A, 21B, and 21C, respectively. In the phosphor sheet 22A, a phosphor 27A similar to the phosphor 17A is dispersedly mixed. In the phosphor sheet 22B, a phosphor 27B similar to the phosphor 17B is dispersedly mixed. In the phosphor sheet 22C, a phosphor 27C similar to the phosphor 17C and a phosphor 27D similar to the phosphor 17D are dispersedly mixed.

The white reflection resin 23C is disposed on the substrate 25 so as to be provided between the phosphor sheets 22B and 22C. The white reflection resin 23C is provided in a position interrupting at least a portion between the side face of the phosphor sheet 22B and the side face of the phosphor sheet 22C opposed to the side face of the phosphor sheet 22B. The white reflection resin 23C reflects light emitted from the phosphor sheet 22B to the phosphor sheet 22B side and reflects light emitted from the phosphor sheet 22C to the phosphor sheet 22C side.

Except for the above point, the configuration of the light emitting device 20 is the same as that of the light emitting device 10.

As described above, the peak wavelength of the light which is wavelength-converted by the phosphor 27A is equal to or less than the peak wavelength of the light which is wavelength-converted by the phosphor 27B, and the peak wavelength of the light which is wavelength-converted by the phosphor 27B is equal to or less than the peak wavelength of the light which is wavelength-converted by the phosphor 27C and is equal to or less than the peak wavelength of the light which is wavelength-converted by the phosphor 27D.

In other words, the phosphor sheet 22C is configured by combining the phosphors 27C and 27D whose wavelengths of lights converted are close to each other. Therefore, in the light emitting device 20, the amount of the phosphor contained in the phosphor sheet 22C can be made small and the intensity of light emitted can be made high. In addition, manufacturing variations of the phosphor sheets can be also suppressed.

Figure 6A:
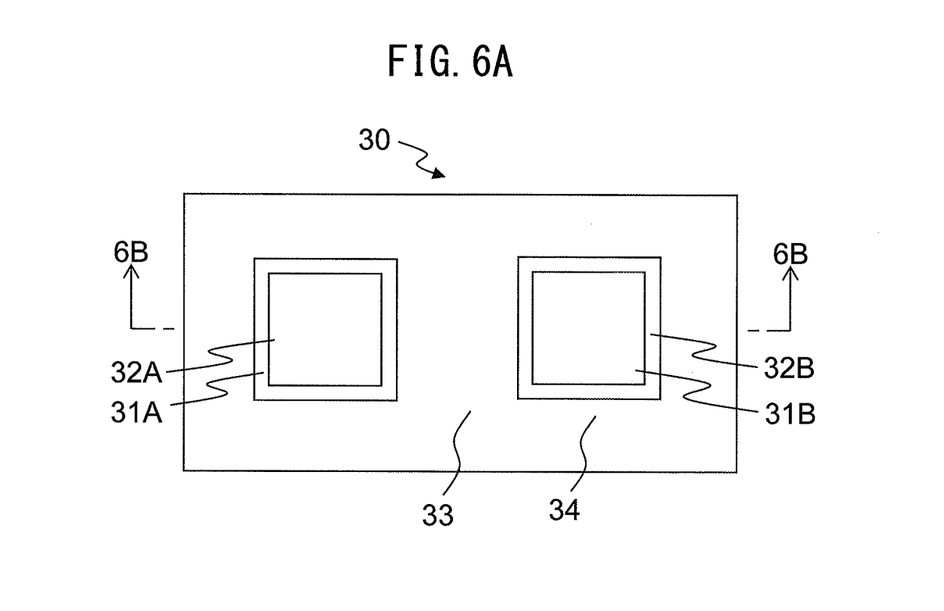
FIG. 6A is a schematic top view of a light emitting device 30.
Figure 6B:
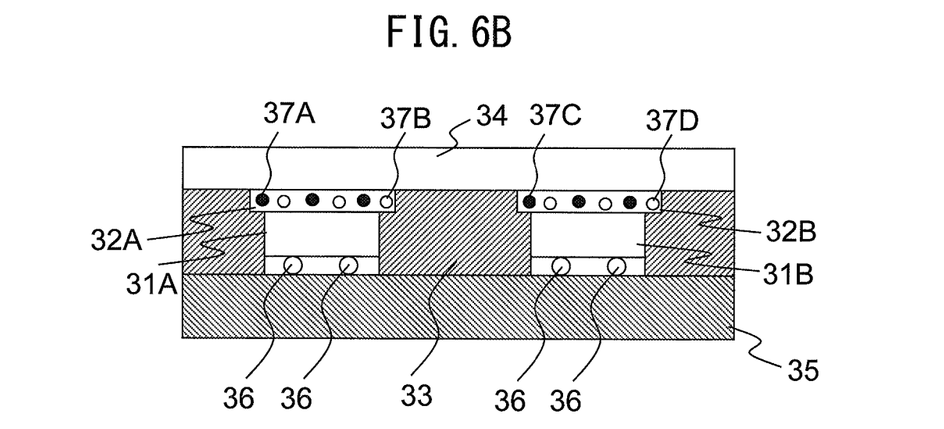
FIG. 6B is a schematic cross section of a light emitting device 30.

FIG. 6A is a schematic top view of a light emitting device 30. FIG. 6B is a cross section taken along line A-A' in FIG. 6A. In the light emitting device 30, a white reflection resin 33 is disposed in the whole of the light emitting device 30 to the height of the top faces of phosphor sheets 32A and 32B, and top faces of the phosphor sheets 32A and 32B and the white reflection resin 33 are covered with a diffusion resin 34. Except for the above point, the configuration of the light emitting device 30 is the same as the light emitting device 10.

As described above, in the light emitting devices 10 to 30, by configuring each of the phosphor sheets by combining phosphors having close wavelengths which are to be converted, the amount of the phosphors included in each of the phosphor sheets can be reduced and the intensity of light to be emitted can be increased. In addition, manufacturing variations in respective phosphor sheets can be suppressed.

Further, in the light emitting devices 10 to 30, a plurality of kinds of phosphors are separately disposed to a plurality of phosphor sheets, and the white reflection resin is provided between the phosphor sheets. Thereby, light which is wavelength-converted by a specific phosphor is absorbed by another phosphor and wavelength-converted to light having a longer wavelength is suppressed. Therefore, white light having higher color rendering index can be obtained.

Each of the light emitting devices 10 to 30 can be used, for example, as a light source such as a back light in a liquid crystal display of a large area. Each of the light emitting devices 10 to 30 can be also used as various illuminating light sources such as a light guide plate lighting in a liquid crystal display of a small area in a cellular phone and a back light unit of meters or indicators.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light emitting device comprising:
   a first blue light emitting element;
   a second blue light emitting element;
   a first phosphor sheet containing a first phosphor and a third phosphor different from the first phosphor, and covering a top face of the first blue light emitting element; and
   a second phosphor sheet containing a second phosphor different from the first phosphor and a fourth phosphor different from the second phosphor, and covering a top face of the second blue light emitting element,
   wherein a peak wavelength of, light which is wavelength-converted by the first phosphor is less than a peak wavelength of light which is wavelength-converted by the third phosphor, and the peak wavelength of light which is wavelength-converted by the third phosphor is equal to or less than a peak wavelength of light which is wavelength-converted by the second phosphor, and the peak wavelength of light which is wavelength-converted by the second phosphor is less than a peak wavelength of light which is wavelength-converted by the fourth phosphor, and
   the first phosphor sheet does not contain a phosphor wavelength-converting to lights having a peak wavelength more than the peak wavelength of light which is wavelength-converted by the second phosphor, and the second phosphor sheet does not contain a phosphor wavelength-converting to lights having a peak wavelength less than the peak wavelength of light which is wavelength-converted by the third phosphor.

2. The light emitting device according to claim 1, further comprising a white reflection resin provided between the first phosphor sheet and the second phosphor sheet.

3. The light emitting device according to claim 2, wherein the white reflection resin is provided in a position interrupting a portion between a side face of the first phosphor sheet and a side face of the second phosphor sheet opposed to the side face of the first phosphor sheet.

* * * * *